(12) United States Patent
Hirose et al.

(10) Patent No.: US 12,002,894 B2
(45) Date of Patent: Jun. 4, 2024

(54) PHOTOSENSOR

(71) Applicant: Sumitomo Electric Industries, Ltd., Osaka (JP)

(72) Inventors: Kotaro Hirose, Osaka (JP); Masahiro Adachi, Osaka (JP); Yoshiyuki Yamamoto, Osaka (JP); Shunsuke Fujii, Osaka (JP); Fuminori Mitsuhashi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 389 days.

(21) Appl. No.: 17/567,194

(22) Filed: Jan. 3, 2022

(65) Prior Publication Data

US 2022/0123156 A1   Apr. 21, 2022

Related U.S. Application Data

(63) Continuation of application No. PCT/JP2020/024591, filed on Jun. 23, 2020.

(30) Foreign Application Priority Data

Jul. 5, 2019 (JP) .................................. 2019-125867

(51) Int. Cl.
*H01L 31/0216* (2014.01)
*H01L 31/0224* (2006.01)
*H01L 31/024* (2014.01)

(52) U.S. Cl.
CPC ...... *H01L 31/0216* (2013.01); *H01L 31/0224* (2013.01); *H01L 31/024* (2013.01)

(58) Field of Classification Search
None
See application file for complete search history.

(56) References Cited

U.S. PATENT DOCUMENTS

| 4,111,717 A | * | 9/1978 | Baxter | ................... | H10N 10/17 |
| | | | | | 136/214 |
| 5,393,351 A | * | 2/1995 | Kinard | ................... | H10N 10/17 |
| | | | | | 136/211 |

(Continued)

FOREIGN PATENT DOCUMENTS

| JP | 2000-340848 A | 12/2000 |
| JP | 2001-44522 A | 2/2001 |

(Continued)

*Primary Examiner* — Evren Seven
(74) *Attorney, Agent, or Firm* — XSENSUS LLP

(57) ABSTRACT

A photosensor includes: a support; a thermoelectric conversion material section that is disposed on a first main surface of the support and that includes a plurality of first material layers each having an elongated shape, a plurality of second material layers each having electrical conductivity and an elongated shape, and an insulating film, the first material layers and the second material layers each being configured to convert thermal energy into electrical energy; a heat sink that is disposed on a second main surface of the support and along an outer edge of the support; a light-absorbing film that is disposed in a region surrounded by inner edges of the heat sink as viewed in a thickness direction of the support so as to form temperature differences on the first main surface of the support in longitudinal directions of the first material layers.

23 Claims, 10 Drawing Sheets

(56) References Cited

U.S. PATENT DOCUMENTS

| | | | | |
|---|---|---|---|---|
| 6,203,194 | B1* | 3/2001 | Beerwerth | G01J 5/12 |
| | | | | 136/227 |
| 6,348,650 | B1* | 2/2002 | Endo | G01J 5/12 |
| | | | | 136/224 |
| 6,388,186 | B1* | 5/2002 | Nomura | G01K 7/04 |
| | | | | 136/224 |
| 6,870,086 | B2* | 3/2005 | Hamamoto | H10N 10/01 |
| | | | | 427/58 |
| 7,282,712 | B2* | 10/2007 | Shibayama | G01J 5/12 |
| | | | | 250/338.4 |
| 8,552,380 | B1* | 10/2013 | Florin | G01J 5/023 |
| | | | | 250/338.4 |
| 2007/0297485 | A1 | 12/2007 | Ernst et al. | |

FOREIGN PATENT DOCUMENTS

| | | |
|---|---|---|
| JP | 2001-527644 A | 12/2001 |
| JP | 2007-309796 A | 11/2007 |
| JP | 2008-501964 A | 1/2008 |
| JP | 2012-215531 A | 11/2012 |
| JP | 2015-169533 A | 9/2015 |
| JP | 2015-197371 A | 11/2015 |

* cited by examiner

PHOTOSENSOR

CROSS-REFERENCE TO RELATED APPLICATIONS

The present application is a bypass continuation of PCT Application No. PCT/JP2020/024591, filed Jun. 23, 2020, which claims priority to Japanese Patent Application No. 2019-125867, filed on Jul. 5, 2019, the entire contents of each are incorporated herein by its reference.

BACKGROUND

The present disclosure relates to photosensors.

DESCRIPTION OF THE RELATED ART

There is known a technique related to thermopile infrared sensors using thermoelectric conversion materials that convert a temperature difference (thermal energy) into electrical energy (see, for example, Japanese Unexamined Patent Application Publication No. 2000-340848 (Patent Literature 1)). An infrared sensor includes a light receiver that converts light energy into thermal energy and a thermoelectric converter (thermopile) that converts a temperature difference (thermal energy) into electrical energy. The thermoelectric converter includes thermocouples each composed of a p-type thermoelectric conversion material and an n-type thermoelectric conversion material connected to each other. The output is increased by alternately connecting p-type thermoelectric conversion materials and n-type thermoelectric conversion materials in series.

SUMMARY OF THE INVENTION

A photosensor according to the present disclosure includes: a support; a thermoelectric conversion material section that is disposed on a first main surface of the support and that includes a plurality of first material layers each having an elongated shape and a plurality of second material layers each having electrical conductivity and an elongated shape, the first material layers and the second material layers each being configured to convert thermal energy into electrical energy; a heat sink that is disposed on a second main surface of the support and along an outer edge of the support; a light-absorbing film that is disposed in a region surrounded by inner edges of the heat sink as viewed in a thickness direction of the support so as to form temperature differences on the first main surface of the support in longitudinal directions of the first material layers, the light-absorbing film being configured to convert received light into thermal energy; a first electrode; and a second electrode spaced apart from the first electrode. Each first material layer includes a first region including a first end on one side in the corresponding longitudinal direction and a second region including a second end on the other side in the corresponding longitudinal direction. Each second material layer includes a third region including a third end on one side in the corresponding longitudinal direction and a fourth region including a fourth end on the other side in the corresponding longitudinal direction. The first region and the second region are respectively connected to the third region and the fourth region, so that the first material layers and the second material layers are alternately connected to each other in series. The endmost first material layer is connected to the first electrode, and the endmost second material layer is connected to the second electrode. The first region is disposed in a region between outer edges of the light-absorbing film and the inner edges of the heat sink as viewed in the thickness direction of the support.

DESCRIPTION OF THE PREFERRED EMBODIMENTS

Figure 1:
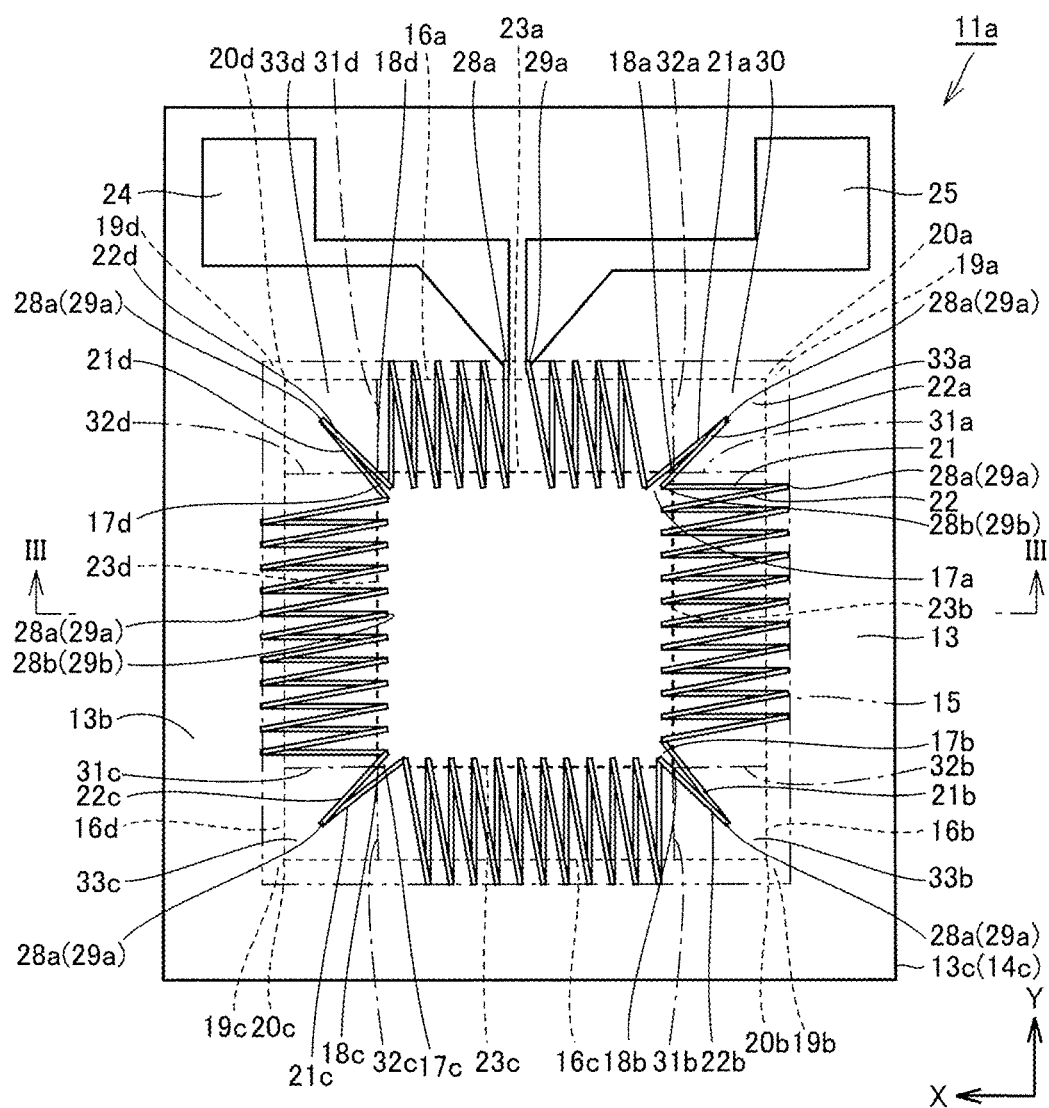
FIG. 1 is a schematic plan view of the appearance of a photosensor according to a first embodiment.

The output $V_{out}$ of a thermopile infrared sensor is given by the following formula (1). The noise $V_n$ of the thermopile infrared sensor is given by the following formula (2).

$$V_{out} = \sum_{n=1}^{N} \Delta T_n \cdot (|\alpha_1| + |\alpha_2|) \quad (1)$$

$$V_n = \left(4 \cdot k \cdot T \cdot \sum_{n=1}^{N} R_n \cdot \Delta f\right)^{1/2} \quad (2)$$

$\Delta T$ is a temperature difference between a hot junction and a cold junction of each thermocouple. N is the number of thermocouples. n is a natural number. $\alpha_1$ is the Seebeck coefficient of a p-type thermoelectric conversion material. $\alpha_2$ is the Seebeck coefficient of an n-type thermoelectric conversion material. k is the Boltzmann constant. T is the average temperature of the thermocouples. $R_n$ is the electrical resistance of each thermocouple. $\Delta f$ is the noise bandwidth.

The specific detectivity D* indicating the performance of a photosensor satisfies the relationship represented by the following formula (3).

$$D* \propto \left(\frac{V_{out}}{V_n}\right) \cdot \Delta f^{\frac{1}{2}} \cdot Q \cdot A^{\frac{1}{2}} \quad (3)$$

Q is an energy per unit time of incident light per unit area of a light-absorbing film. A is the area of the light-absorbing film serving as a light receiver. The specific detectivity D* is proportional to $(V_{out}/V_n) \times \Delta f^{1/2} \times Q \times A^{1/2}$. As $(V_{out}/V_n) \times \Delta f^{1/2} \times Q \times A^{1/2}$ increases, the specific detectivity D* increases. When the ratio of $V_{out}$ to $V_n$ is expressed by the S/N ratio, and the incident light power Q and the area A of the light-absorbing film are the same values, the specific detectivity D* increases with increasing S/N ratio. It is important to increase the S/N ratio in order to improve the specific detectivity D*.

The infrared sensor disclosed in Patent Literature 1 may have insufficient specific detectivity. There is a need to further improve the specific detectivity.

An object of the present disclosure is to provide a photosensor having higher specific detectivity.

According the photosensor, it is possible to further improve the specific detectivity.

First, embodiments of the present disclosure are listed and described. A photosensor according to the present disclosure includes:

a support;

a thermoelectric conversion material section that is disposed on a first main surface of the support and that includes a plurality of first material layers each having an elongated shape and a plurality of second material layers each having electrical conductivity and an elongated shape, the first material layers and the second material layers each being configured to convert thermal energy into electrical energy;

a heat sink that is disposed on a second main surface of the support and along an outer edge of the support;

a light-absorbing film that is disposed in a region surrounded by inner edges of the heat sink as viewed in a thickness direction of the support so as to form temperature differences on the first main surface of the support in longitudinal directions of the first material layers, the light-absorbing film being configured to convert received light into thermal energy;

a first electrode; and a second electrode spaced apart from the first electrode.

Each first material layer includes a first region including a first end on one side in the corresponding longitudinal direction and a second region including a second end on the other side in the corresponding longitudinal direction.

Each second material layer includes a third region including a third end on one side in the corresponding longitudinal direction and a fourth region including a fourth end on the other side in the corresponding longitudinal direction.

The first region and the second region are respectively connected to the third region and the fourth region, so that the first material layers and the second material layers are alternately connected to each other in series.

The endmost first material layer is connected to the first electrode, and the endmost second material layer is connected to the second electrode.

The first region is disposed in a region between outer edges of the light-absorbing film and the inner edges of the heat sink as viewed in the thickness direction of the support.

In the photosensor according to the present disclosure, each first material layer is disposed such that the first region including the first end is located on the outer edge side, and the second region including the second end is located on the central side. As viewed in the thickness direction of the support, the first region serves as a cold junction located on the outer edge side, and the second region serves as a hot junction located on the central side.

When the first region overlaps the heat sink as viewed in the thickness direction of the support, a temperature difference formed between the first region and the second region of each first material layer is equal to a temperature difference formed between the light-absorbing film and the heat sink. In this case, the temperature gradient in the support is not uniform. Specifically, the temperature does not decrease uniformly with the same temperature gradient from the center to the outer edge, specifically, from the position of the light-absorbing film to the position of the heat sink, but the temperature gradient is large in some region and small in some region as viewed in the thickness direction of the support. If a first material layer is disposed in a region where the temperature gradient is small, the effect of the electrical resistance and thermal resistance of the first material layer is greater than the effect of a temperature difference between the first region and the second region. In this case, the S/N ratio cannot be increased. As a result, the specific detectivity D* of the photosensor may not be improved.

The region between the outer edges of the light-absorbing film and the inner edges of the heat sink shows a large temperature gradient. By disposing the first region in this region, a large electrical energy based on a temperature difference can be outputted using a large temperature gradient formed between the first region and the second region. Since the first material layers are not designed to extend from a region in which the light-absorbing film is disposed to a region in which the heat sink is disposed, the first material layers can be shortened. This configuration can reduce the effect of the electrical resistance and thermal resistance of the first material layers. The presence of a plurality of the first material layers can increase the output. As a result, the S/N ratio is increased to improve the specific detectivity D* of the photosensor.

The first material layers may be disposed in contact with the first main surface of the support. The second material layers may be disposed on the first main surface of the support or on part of the first material layers.

The photosensor of the present disclosure may further include an insulating film disposed in contact with the support. The second material layers may be disposed on part of the insulating film and on part of the first material layers.

In the photosensor, as viewed in the thickness direction of the support, the light-absorbing film may include a first corner defined by a first outer edge extending in a first direction and a second outer edge extending in a second direction intersecting the first direction. The second outer edge is connected to the first outer edge at a first vertex, and the first corner protrudes toward the outer edge of the support. In the region between the outer edges of the light-absorbing film and the inner edges of the heat sink, a region near the first corner protruding toward the outer edge of the support is unlikely to decrease its temperature steeply toward the outer edge and tends to maintain high temperature. Therefore, the first region is disposed in a region near the first corner to efficiently use a portion having a large temperature gradient, whereby the S/N ratio is increased to improve the specific detectivity D* of the photosensor.

In the photosensor, the first region may be disposed in a region between an extension line of the first outer edge extending away from the first outer edge across the first vertex and an extension line of the second outer edge extending away from the second outer edge across the first vertex. The region between the extension line of the first outer edge and the extension line of the second outer edge tends to have a large temperature gradient. The first region is thus disposed in the region having a large temperature gradient between the extension line of the first outer edge and the extension line of the second outer edge, whereby the S/N ratio is increased to improve the specific detectivity D* of the photosensor.

In the photosensor, the length of the first material layers may be 10% or more and 120% or less of the distance from the first vertex to an inner edge of the heat sink at the shortest distance from the first vertex. The percentage of the length of the first material layers relative to the distance from the first vertex to an inner edge of the heat sink at the shortest distance from the first vertex is accordingly adjusted so as to make well balanced the effect of the length of the first material layers and the output of electrical energy generated by the temperature gradient, whereby the specific detectivity D* of the photosensor can be improved more efficiently.

In the photosensor, the first corner may have an angle of 90 degrees or less as viewed in the thickness direction of the support. When the first corner has an angle of 90 degrees or less, it is easy to maintain high temperature in a region near the first corner defined by the first outer edge and the second outer edge. The temperature gradient can thus be increased by assuredly maintaining high temperature in a region near the first corner. Therefore, the specific detectivity D* of the photosensor can be improved more efficiently.

In the photosensor, the light-absorbing film may have a plurality of the first corners, and the first corners may each have an angle of 90 degrees or less as viewed in the thickness direction of the support. It is thus easy to increase the number of corners prone to high temperatures in the photosensor to increase the number of regions having a large temperature gradient. It is therefore easy to increase the S/N ratio to improve the specific detectivity D* of the photosensor.

In the photosensor, the joints between the second regions and the fourth regions may overlap the light-absorbing film as viewed in the thickness direction of the support. The geometric shape defined by a virtual line connecting adjacent joints may form along the outer edges of the light-absorbing film as viewed in the thickness direction of the support. This configuration can provide a photosensor efficiently making use of a temperature difference formed by the light-absorbing film and the heat sink.

In the photosensor, the first or second material layers or the first and second material layers are made of semiconductors. Since a semiconductor has a relatively low thermal conductivity, the specific detectivity D* of the photosensor can be improved.

In the photosensor, the first material layers and the second material layers may be made of semiconductors. The second material layers may have a conductivity type different from that of the first material layers and convert temperature differences between the third regions and the fourth regions into electrical energy. With this configuration, the output can be increased by adding the output obtained by the second material layers to the output obtained by the first material layers.

In the photosensor, the first material layers may be made of a semiconductor containing Si and Ge as base elements. Such a semiconductor is preferably used as a material of the photosensor.

DETAILS OF EMBODIMENTS OF PRESENT DISCLOSURE

Next, an embodiment of a photosensor according to the present disclosure will be described with reference to the drawings. In the following drawings, any identical or corresponding parts will be assigned with the same reference characters, and no redundant description thereof will be provided.

First Embodiment

Figure 2:
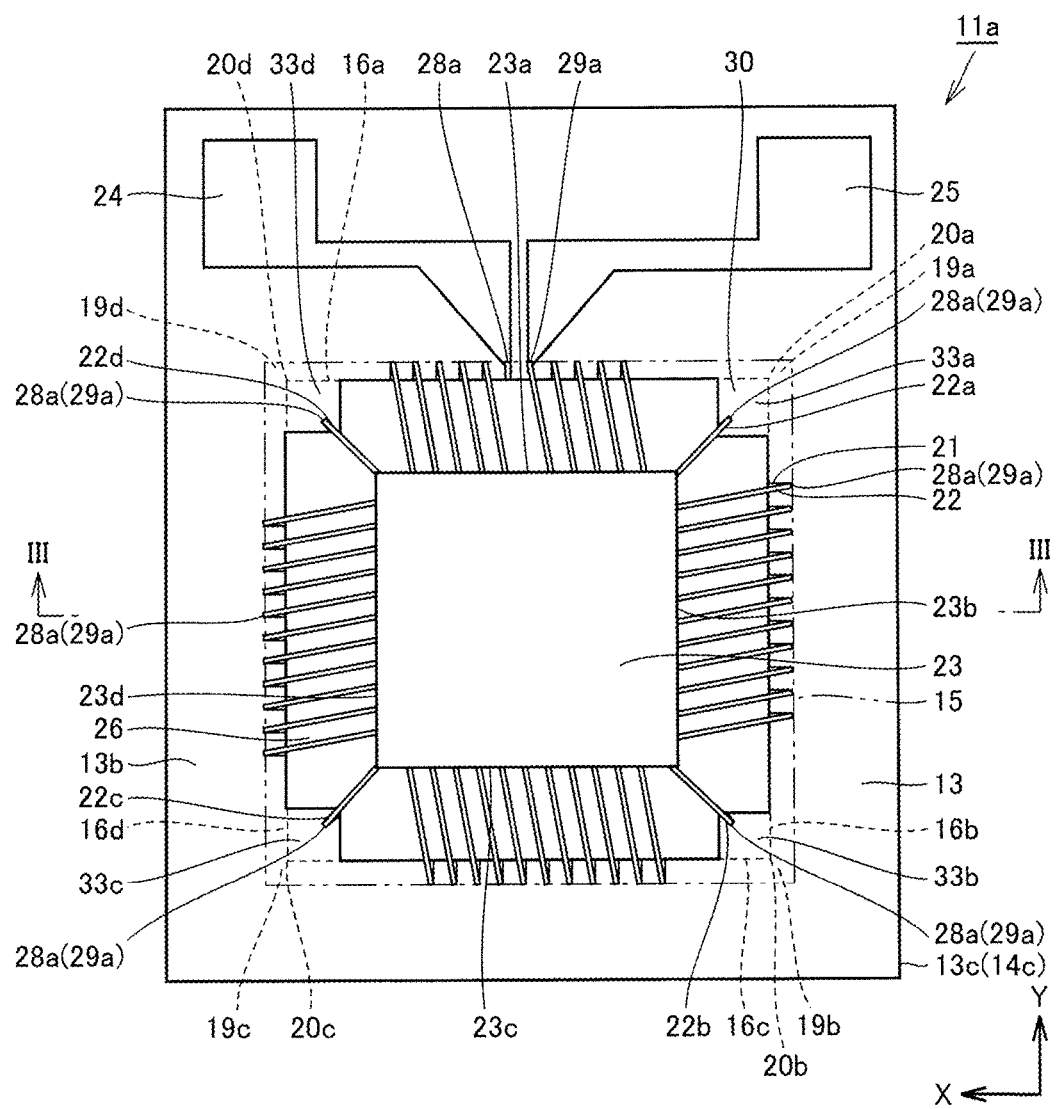
FIG. 2 is a schematic plan view of the appearance of the photosensor according to the first embodiment.
Figure 3:
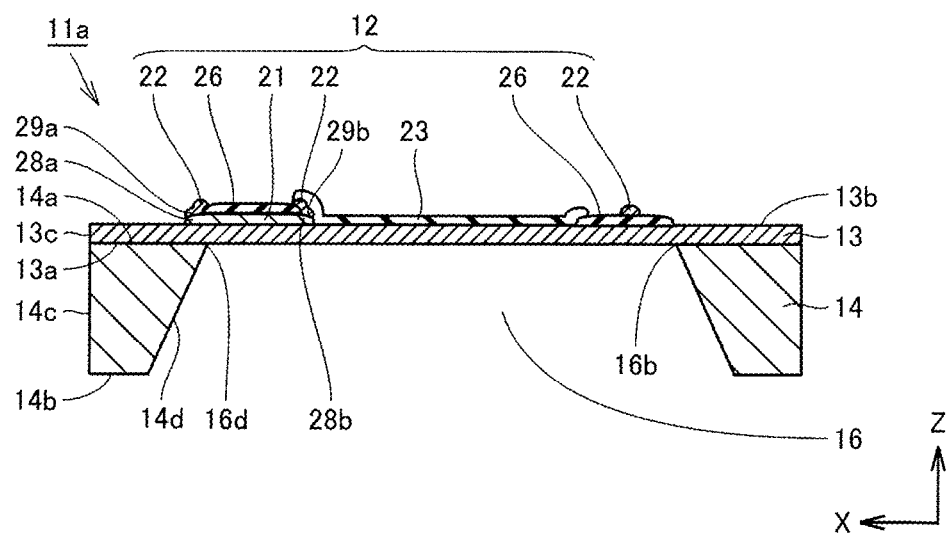
FIG. 3 is a schematic cross-sectional view illustrating part of a cross section taken along line of FIG. 1.
Figure 4:
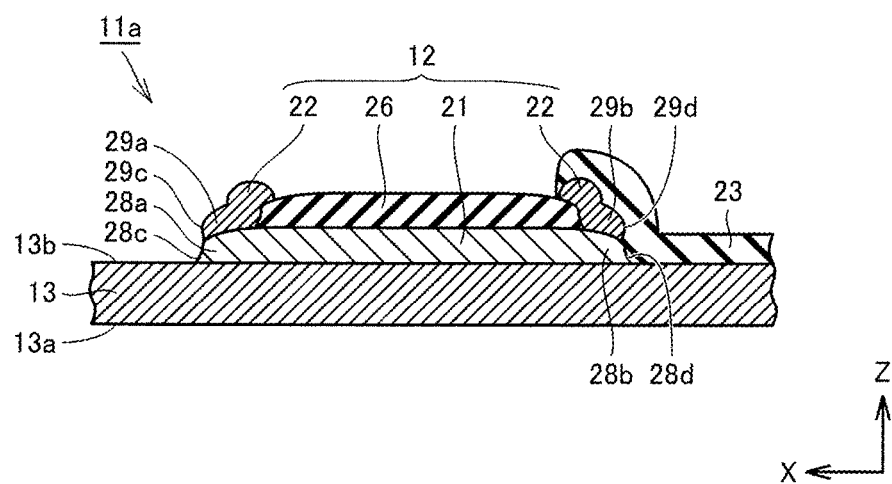
FIG. 4 is a schematic cross-sectional view illustrating part of the photosensor according to the first embodiment.

A photosensor according to a first embodiment of the present disclosure will be described. FIG. 1 and FIG. 2 are schematic plan views of the appearance of the photosensor according to the first embodiment. For easy understanding, an infrared-absorbing film and an insulating film, which are described below, are not shown in FIG. 1. In FIG. 1, the outer edges of the infrared-absorbing film when it is disposed are indicated by broken lines. FIG. 3 is a schematic cross-sectional view illustrating a cross section taken along line of FIG. 1 and FIG. 2. FIG. 4 is a schematic cross-sectional view illustrating part of the photosensor according to the first embodiment. FIG. 4 is an enlarged schematic cross-sectional view of a part including a first region, a second region, a third region, and a fourth region, which are described below.

Referring to FIG. 1, FIG. 2, FIG. 3, and FIG. 4, a photosensor 11a is, for example, an infrared sensor. The photosensor 11a includes a support 13, a thermoelectric conversion material section 12 disposed on a first main surface 13b of the support 13, a heat sink 14, an infrared-absorbing film 23 serving as a light-absorbing film, a first electrode 24, and a second electrode 25. The thermoelectric conversion material section 12 includes a plurality of first material layers 21 including first material layers 21a, 21b, 21c, and 21d and a plurality of second material layers 22 including second material layers 22a, 22b, 22c, and 22d. In this embodiment, the thermoelectric conversion material section 12 includes 47 first material layers 21 and 47 second material layers 22. The photosensor 11a detects infrared radiation impinging on the photosensor 11a by detecting a potential difference between the first electrode 24 and the second electrode 25. When the entire photosensor 11a has a plate shape, the thickness direction of the photosensor 11a is expressed by the direction indicated by the arrow Z in FIG. 3.

The support 13 is a thin film and has a rectangular shape as viewed in the thickness direction. The support 13 supports the thermoelectric conversion material section 12 including the first material layers 21 and the second material layers 22, the infrared-absorbing film 23, the first electrode 24, and the second electrode 25. The support 13 is formed of, for example, a $SiO_2/SiN/SiO_2$ film. In other words, the support 13 includes $SiO_2$, SiN, and $SiO_2$ layers stacked on top of each other.

The heat sink 14 is disposed along an outer edge 13c, which is the outer edge of the entire support 13. An outer edge 14c, which is the outer edge of the entire heat sink 14, and the outer edge 13c of the support 13 extend together in the Z direction. The heat sink 14 includes a first surface 14a and a second surface 14b, which are distant from each other in the thickness direction of the photosensor 11a. The heat sink 14 is disposed on a second main surface 13a of the support 13. Specifically, the heat sink 14 is disposed such that the first surface 14a of the heat sink 14 is in contact with the second main surface 13a of the support 13. The second surface 14b of the heat sink 14 is exposed. The heat sink 14 is represented by two trapezoids in the cross section shown in FIG. 3. The surface 14a corresponds to the longer side of a pair of parallel sides of each trapezoid in the cross section shown in FIG. 3. The heat sink 14 is much thicker than the support 13. For example, the heat sink 14 is 10 times or more thicker than the support 13. The heat sink 14 is made of, for example, Si.

The photosensor 11a has a recess 16 recessed in the thickness direction. In a region corresponding to the recess 16 as viewed from the surface 14b, the support 13 (specifically, the second main surface 13a of the support 13) is exposed. An inner surface 14d of the heat sink 14 surrounding the recess 16 is tapered such that the opening of the recess 16 adjacent to the surface 14b is widened. The recess 16 is formed by, for example, anisotropic wet etching of a Si substrate having a plate shape. The recess 16 can prevent or reduce the escape of heat from the infrared-absorbing film 23 to the heat sink 14. This configuration can further increase temperature differences in the longitudinal directions of the first material layers 21 and the second material layers 22.

In FIG. 1, inner edges 16a, 16b, 16c, and 16d of the heat sink 14, which are boundaries between the heat sink 14 and the support 13, are indicated by broken lines in FIG. 1. Referring to FIG. 1, the inner edges 16a, 16b, 16c, and 16d of the heat sink 14 form a square as viewed in the thickness direction of the support 13 in this embodiment. The inner edge 16a and the inner edge 16c extend in the X direction, or the first direction. The inner edge 16b and the inner edge 16d extend in the Y direction, or the second direction. The first direction and the second direction intersect at right angles as viewed in the thickness direction of the support 13.

Each first material layer 21 has an elongated shape. Each first material layer 21 includes a first region 28a including a first end 28c on one side in the corresponding longitudinal direction and a second region 28b including a second end 28d on the other side in the corresponding longitudinal direction. The direction in which a line connecting the first region 28a and the second region 28b extends corresponds to the longitudinal direction of each first material layer 21 having an elongated shape. Each first material layer 21 converts a temperature difference between the first region 28a and the second region 28b into electrical energy. Each first material layer 21 is disposed on the first main surface 13b of the support 13. Each first material layer 21 is disposed in contact with the first main surface 13b of the support 13. In each first material layer 21, the first region 28a is disposed adjacent to the inner edge 16a, 16b, 16c, or 16d of the heat sink 14, and the second region 28b is disposed adjacent to outer edge 23a, 23b, 23c, or 23d of the infrared-absorbing film 23, as viewed in the thickness direction of the support 13. Each first material layer 21 is made of a first conductivity type, or p-type, semiconductor. The material of each first material layer 21 made of a p-type thermoelectric conversion material is selected from, for example, a compound semiconductor containing Si and Ge as base elements and Au as an added element.

Each second material layer 22 has an elongated shape. Each second material layer 22 includes a third region 29a including a third end 29c on one side in the corresponding longitudinal direction and a fourth region 29b including a fourth end 29d on the other side in the corresponding longitudinal direction. The direction in which a line connecting the third region 29a and the fourth region 29b extends corresponds to the longitudinal direction of each second material layer 22 having an elongated shape. Each second material layer 22 converts a temperature difference between the third region 29a and the fourth region 29b into electrical energy. The second material layers 22 are disposed on part of an insulating film 26 described below in contact with the support 13 and on part of the first material layers 21.

In each second material layer 22, the third region 29a is disposed adjacent to the inner edge 16a, 16b, 16c, or 16d of the heat sink 14, and the fourth region 29b is disposed adjacent to the outer edge 23a, 23b, 23c, or 23d of the infrared-absorbing film 23, as viewed in the thickness direction of the support 13. Each second material layer 22 is made of a second conductivity type, or n-type, semiconductor, which is different from the first conductivity-type semiconductor. The material of each second material layer 22 made of the n-type thermoelectric conversion material is, for example, bismuth (Bi).

The first material layers 21 and the second material layers 22 are disposed within a region 15 on the support 13 indicated by a rectangular shape of a chain double-dashed line in FIG. 1. The first material layers 21 and the second material layers 22 in the thermoelectric conversion material section 12 convert temperature differences (thermal energy) into electrical energy. The thermoelectric conversion material section 12 includes the insulating film 26. The material of the insulating film 26 is, for example, $SiO_2$. The arrangement of the first material layers 21 and the second material layers 22 will be described below.

The infrared-absorbing film 23 is disposed on the first main surface 13b of the support 13, on part of the first material layers 21, on part of the second material layers 22, and on part of the insulating film 26. The infrared-absorbing film 23 is disposed so as to form temperature differences in the longitudinal directions of the first material layers 21, namely, between the first regions 28a and the second regions 28b. Specifically, the infrared-absorbing film 23 exposes the first regions 28a of the first material layers 21 and the third regions 29a of the second material layers 22 and covers the second regions 28b of the first material layers 21 and the fourth regions 29b of the second material layers 22. In this embodiment, the infrared-absorbing film 23 is disposed so as to form temperature differences in the longitudinal directions of the second material layers 22, namely, between the third regions 29a and the fourth regions 29b. The infrared-absorbing film 23 is disposed in a region surrounded by the inner edges 16a, 16b, 16c, and 16d of the heat sink 14 as viewed in the thickness direction of the support 13.

Referring to FIG. 1, the infrared-absorbing film 23 having the outer edges 23a, 23b, 23c, and 23d has a square shape as viewed in the thickness direction of the support 13 in this embodiment. The outer edge 23a and the outer edge 23c extend in the X direction. The outer edge 23b and the outer edge 23d extend in the Y direction. The outer edge 23a extends along the inner edge 16a. The outer edge 23b extends along the inner edge 16b. The outer edge 23c extends along the inner edge 16c. The outer edge 23d extends along the inner edge 16d.

The infrared-absorbing film 23 includes corners 17a, 17b, 17c, and 17d as first corners protruding toward the outer edge 13c of the support 13. In this embodiment, the infrared-absorbing film 23 includes the corners 17a, 17b, 17c, and 17d as four first corners. The corner 17a is defined by the outer edge 23a, which is a first outer edge, and the outer edge 23b, which is a second outer edge, connected to the outer edge 23a at a first vertex 18a as viewed in the thickness direction of the support 13. The corner 17b is defined by the outer edge 23b, which is a second outer edge, and the outer edge 23c, which is a first outer edge, connected to the outer edge 23b at a first vertex 18b as viewed in the thickness direction of the support 13. The corner 17c is defined by the outer edge 23c, which is a first outer edge, and the outer edge 23d, which is a second outer edge, connected to the outer edge 23c at a first vertex 18c as viewed in the thickness direction of the support 13. The corner 17d is defined by the outer edge 23d, which is a second outer edge, and the outer edge 23a, which is a first outer edge, connected to the outer edge 23d at a first vertex 18d as viewed in the thickness direction of the support 13. The corners 17a, 17b, 17c, and 17d each have an angle of 90 degrees as viewed in the thickness direction of the support 13.

With regard to the infrared-absorbing film 23, the square formed by the outer edges 23a, 23b, 23c, and 23d of the infrared-absorbing film 23 is concentric with the square formed by the inner edges 16a, 16b, 16c, and 16d of the heat sink 14 as viewed in the thickness direction of the support 13. The infrared-absorbing film 23 converts infrared radiation into heat. The material of the infrared-absorbing film 23 is, for example, carbon (C).

The heat sink 14 includes corners 19a, 19b, 19c, and 19d as second corners. In this embodiment, the heat sink 14 includes the corners 19a, 19b, 19c, and 19d as four second corners. The corner 19a is defined by the inner edge 16a, which is a first inner edge, extending along the outer edge 23a and the inner edge 16b, which is a second inner edge, extending along the outer edge 23b and connected to the inner edge 16a at a second vertex 20a as viewed in the thickness direction of the support 13. The corner 19b is defined by the inner edge 16b, which is a second inner edge, extending along the outer edge 23b and the inner edge 16c, which is a first inner edge, extending along the outer edge 23c and connected to the inner edge 16b at a second vertex 20b as viewed in the thickness direction of the support 13. The corner 19c is defined by the inner edge 16c, which is a first inner edge, extending along the outer edge 23c and the inner edge 16d, which is a second inner edge, extending along the outer edge 23d and connected to the inner edge 16c at a second vertex 20c as viewed in the thickness direction of the support 13. The corner 19d is defined by the inner edge 16d, which is a second inner edge, extending along the outer edge 23d and the inner edge 16a, which is a first inner edge, extending along the outer edge 23a and connected to the inner edge 16d at a second vertex 20d as viewed in the thickness direction of the support 13. The corners 19a, 19b, 19c, and 19d each have an angle of 90 degrees as viewed in the thickness direction of the support 13.

Next, the arrangement of the thermoelectric conversion material section 12 and the infrared-absorbing film 23 will be described. Specifically, the insulating film 26 is disposed on the first material layers 21 in areas in which the first material layers 21 are disposed, and disposed on the first main surface 13b of the support 13 in areas in which no first material layers 21 are disposed. The insulating film 26 does not cover the first regions 28a or the second regions 28b of the first material layers 21. The second material layers 22 are disposed on part of the first main surface 13b of the support 13, on part of the insulating film 26, and on part of the first material layers 21. The second material layers 22 are disposed such that the first regions 28a of the first material layers 21 are in contact with the third regions 29a of the second material layers 22, and the second regions 28b of the first material layers 21 are in contact with the fourth regions 29b of the second material layers 22.

The infrared-absorbing film 23 is disposed on part of the first main surface 13b of the support 13, on part of the insulating film 26, and on part of the second material layers 22. The infrared-absorbing film 23 is disposed so as to expose the first regions 28a of the first material layers 21 and the third regions 29a of the second material layers 22. The infrared-absorbing film 23 is disposed so as to cover the second regions 28b of the first material layers 21 and the fourth regions 29b of the second material layers 22. Specifically, the joints between the second regions 28b and the fourth regions 29b overlap the infrared-absorbing film 23 as viewed in the thickness direction of the support 13. The geometric shape defined by a virtual line connecting adjacent joints forms along the outer edges 23a, 23b, 23c, and 23d of the infrared-absorbing film 23 as viewed in the thickness direction of the support 13. The first regions 28a of the first material layers 21 and the third regions 29a of the second material layers 22 are not covered by the infrared-absorbing film 23. In other words, the first material layers 21 and the second material layers 22 are thermally connected to the infrared-absorbing film 23 so as to form temperature differences in the longitudinal directions of the first material layers 21 and the second material layers 22. The heat from the infrared-absorbing film 23 is transmitted to the second regions 28b of the first material layers 21 and the fourth regions 29b of the second material layers 22. This configuration forms temperature differences in the longitudinal directions of the first material layers 21 and the second material layers 22. This configuration can provide a photosensor 11a efficiently making use of a temperature difference formed by the infrared-absorbing film 23 and the heat sink 14.

Next, the arrangement of the first material layers 21 and the second material layers 22 will be described. The first material layers 21 are spaced apart from each other. The first material layers 21 other than the first material layers 21a, 21b, 21c, and 21d are disposed such that their longitudinal directions are in the X direction or the Y direction. The first material layers 21 other than the first material layers 21a, 21b, 21c, and 21d are disposed so as to extend from one side to the corresponding opposite side of the region 15 having a square shape (such that their longitudinal directions are in the X direction or the Y direction). Except for the first region 28a connected to the first electrode 24 and the third region 29a connected to the second electrode 25, the first material layers 21 and the second material layers 22 are alternately connected to each other. Specifically, the first region 28a of one first material layer 21 is connected to the third region 29a of one second material layer 22 adjacent to one side of the first material layer 21. The second region 28b of the first material layer 21 is connected to the fourth region 29b of one second material layer 22 adjacent to the other side of the first material layer 21. With regard to the first material layers 21 and the second material layers 22, the second regions 28b are connected to the fourth regions 29b, and the first regions 28a other than the first region 28a connected to the first electrode 24 are connected to the third regions 29a other than the third region 29a connected to the second electrode 25. In other words, the first material layers 21 and the second material layers 22 form pairs, and the first material layers 21 and the adjacent second material layers 22 are alternately connected to each other at regions including their ends.

Except for four pairs of the first material layers 21a, 21b, 21c, and 21d and the second material layers 22a, 22b, 22c, and 22d, which are closest to the four corners 17a, 17b, 17c, and 17d, the length of the second material layers 22 in the longitudinal direction is larger than the length of the first material layers 21 in the longitudinal direction. The first material layers 21 have the same length in the longitudinal direction. The second material layers 22 also have the same length in the longitudinal direction. The length of the first material layer 21a will be described below.

The polarity of the voltage generated in the first region 28a including the first end 28c located on one side of one first material layer 21 is opposite to the polarity of the voltage generated in the third region 29a including the third end 29c located on one side of the corresponding second material layer 22 with respect to the direction of the temperature gradient generated upon exposure of the photosensor 11a to light. In this embodiment, upon exposure to light, the first region 28a in each first material layer 21 adjacent to the outer edge 13c of the support 13 has a positive voltage, and the third region 29a in each second material layer 22 adjacent to the outer edge 13c of the support 13 has a negative voltage. The first material layers 21 and the second material layers 22 are always alternately connected to each other. The first region 28a of the endmost first material layer 21 among the first material layers 21 and the second material layers 22 alternately connected to each other is electrically connected to the first electrode 24. The third region 29a of the endmost second material layer 22 among the first material layers 21 and the second material layers 22 alternately connected to each other in series is electrically connected to the second electrode 25. The first electrode 24 and the second electrode 25 are disposed outside the region 15 on the first main surface 13b of the support 13. The first electrode 24 and the second electrode 25 are spaced apart from each other. Each of the first electrode 24 and the second electrode 25 is, for example, a pad electrode. Examples of the material of the first electrode 24 and the second electrode 25 include gold (Au), titanium (Ti), and platinum (Pt).

The first regions 28a of the first material layers 21a, 21b, 21c, and 21d are disposed in a region 30 between the outer edges 23a, 23b, 23c, and 23d of the infrared-absorbing film 23 and the inner edges 16a, 16b, 16c, and 16d of the heat sink 14 as viewed in the thickness direction of the support 13. In this embodiment, the first region 28a of the first material layer 21a is disposed in a region 33a between an extension line 31a of the outer edge 23a extending away from the outer edge 23a across the first vertex 18a and an extension line 32a of the outer edge 23b extending away from the outer edge 23b across the first vertex 18a. The third region 29a of the second material layer 22a connected to the first region 28a of the first material layer 21a is also disposed in the same region 33a. The first region 28a of the first material layer 21b is disposed in a region 33b between an extension line 31b of the outer edge 23b extending away from the outer edge 23b across the first vertex 18b and an extension line 32b of the outer edge 23c extending away from the outer edge 23c across the first vertex 18b. The third region 29a of the second material layer 22b connected to the first region 28a of the first material layer 21b is also disposed in the same region 33b. The first region 28a of the first material layer 21c is disposed in a region 33c between an extension line 31c of the outer edge 23c extending away from the outer edge 23c across the first vertex 18c and an extension line 32c of the outer edge 23d extending away from the outer edge 23d across the first vertex 18c. The third region 29a of the second material layer 22c connected to the first region 28a of the first material layer 21c is also disposed in the same region 33c. The first region 28a of the first material layer 21d is disposed in a region 33d between an extension line 31d of the outer edge 23d extending away from the outer edge 23d across the first vertex 18d and an extension line 32d of the outer edge 23a extending away from the outer edge 23a across the first vertex 18d. The third region 29a of the second material layer 22d connected to the first region 28a of the first material layer 21d is also disposed in the same region 33d. The extension lines 31a, 31b, 31c, 31d, 32a, 32b, 32c, and 32d are each indicated by a dash-dotted line.

The length of the first material layer 21a is 10% or more and 120% or less of the distance from the first vertex 18a to the inner edge 16a or 16b of the heat sink 14 at the shortest distance from the first vertex 18a. In this embodiment, the distance from the first vertex 18a to the inner edge 16a or 16b of the heat sink 14 at the shortest distance from the first vertex 18a corresponds to the shorter one of the length of the normal to the broken line indicating the inner edge 16a from the first vertex 18a and the length of the normal to the broken line indicating the inner edge 16b from the first vertex 18a as viewed in the thickness direction of the support 13. The length of the first material layer 21b is 10% or more and 120% or less of the distance from the first vertex 18b to the inner edge 16b or 16c of the heat sink 14 at the shortest distance from the first vertex 18b. In this embodiment, the distance from the first vertex 18b to the inner edge 16b or 16c of the heat sink 14 at the shortest distance from the first vertex 18b corresponds to the shorter one of the length of the normal to the broken line indicating the inner edge 16b from the first vertex 18b and the length of the normal to the broken line indicating the inner edge 16c from the first vertex 18b as viewed in the thickness direction of the support 13. The length of the first material layer 21c is 10% or more and 120% or less of the distance from the first vertex 18c to the inner edge 16c or 16d of the heat sink 14 at the shortest distance from the first vertex 18c. In this embodiment, the distance from the first vertex 18c to the inner edge 16c or 16d of the heat sink 14 at the shortest distance from the first vertex 18c corresponds to the shorter one of the length of the normal to the broken line indicating the inner edge 16c from the first vertex 18c and the length of the normal to the broken line indicating the inner edge 16d from the first vertex 18c as viewed in the thickness direction of the support 13. The length of the first material layer 21d is 10% or more and 120% or less of the distance from the first vertex 18d to the inner edge 16d or 16a of the heat sink 14 at the shortest distance from the first vertex 18d. In this embodiment, the distance from the first vertex 18d to the inner edge 16d or 16a of the heat sink 14 at the shortest distance from the first vertex 18d corresponds to the shorter one of the length of the normal to the broken line indicating the inner edge 16d from the first vertex 18d and the length of the normal to the broken line indicating the inner edge 16a from the first vertex 18d as viewed in the thickness direction of the support 13.

Next, a method for producing the photosensor 11a according to the first embodiment will be briefly described. First, a substrate having a plate shape is prepared, and the support 13 is formed on a first main surface of the substrate in the thickness direction. At this time, the substrate is in contact with the second main surface 13a of the support 13. Next, the first material layer 21 is patterned on the first main surface 13b of the support 13. The insulating film 26 is then patterned. Next, the second material layer 22 is formed. The infrared-absorbing film 23 is then patterned. The first material layer 21 is formed in the following manner. First, a layer of lift-off resist is applied onto the first main surface 13b of the support 13. Next, a layer of positive resist is applied onto the lift-off resist. Subsequently, the positive resist is subjected to photolithography and exposed to light, and the exposed resist is dissolved in a developer. Next, a semiconductor material is vapor-deposited to form a pattern, and the resist is removed (lifted-off) from the support 13. The first material layer 21 is patterned accordingly. The second material layer 22 and other layers are patterned similarly.

Next, an activation treatment is performed by heating at about 500° C. to partially crystallize amorphous Si, Ge, and other elements. Subsequently, the recess 16 is formed in a central region of the substrate from a second main surface of the substrate away from the support 13 in the thickness direction. In this case, the recess 16 is recessed from the second main surface of the substrate so as to reach the second main surface 13a of the support 13. The heat sink 14 formed of the substrate is formed accordingly to provide the photosensor 11a.

Next, the operation of the photosensor 11a will be described. Upon exposure of the photosensor 11a to light such as infrared radiation, the infrared-absorbing film 23 convers light energy into thermal energy. In this case, the infrared-absorbing film 23 is formed in a region surrounded by the inner edges 16a, 16b, 16c, and 16d of the heat sink 14, and a portion in which the infrared-absorbing film 23 is disposed has a higher temperature. The temperature does not increase outside the inner edges 16a, 16b, 16c, and 16d since the heat sink 14 is disposed. Focusing on one first material layer 21, the second region 28b of the first material layer 21 has a higher temperature, and the first region 28a of the first material layer 21 has a lower temperature. In other words, a temperature difference is formed between regions including the ends of one first material layer 21 in the longitudinal direction. This temperature difference generates a potential difference. The second material layers 22 each have an elongated shape in the longitudinal direction similarly. Thus, a temperature difference is formed between regions including the ends. This temperature difference generates a potential difference. Since the first material layers 21 are connected to the second material layers 22 in series with alternating polarity, a potential difference between the first electrode 24 and the second electrode 25 is the sum of potential differences generated by temperature differences between the first material layers 21 and the second material layers 22. The photosensor 11a detects light, or infrared radiation in this case, by detecting the current produced by a potential difference between the first electrode 24 and the second electrode 25.

The photosensor 11a includes a plurality of the first material layers 21. The photosensor 11a includes a plurality of the second material layers 22. The first material layers 21 alternate with the second material layers 22 such that the first regions 28a other than the first region 28a connected to the first electrode 24 are connected to the third regions 29a other than the third region 29a connected to the second electrode 25, and the second regions 28b are connected to the fourth regions 29b. Therefore, a potential difference between the first electrode 24 and the second electrode 25 is the sum of potential differences generated in the first material layers 21, which results in a large potential difference. As a result, the output becomes high, and the photosensor 11a has high specific detectivity.

Figure 5:
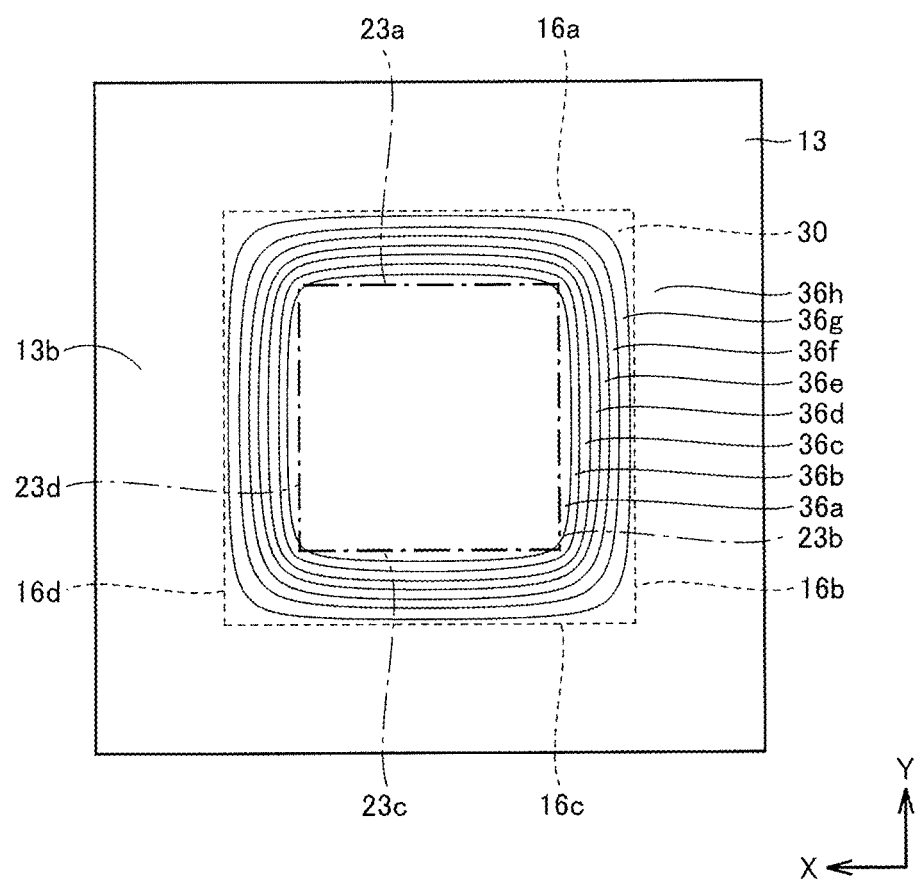
FIG. 5 is a view illustrating the temperature distribution in a first main surface of a support.
Figure 6:
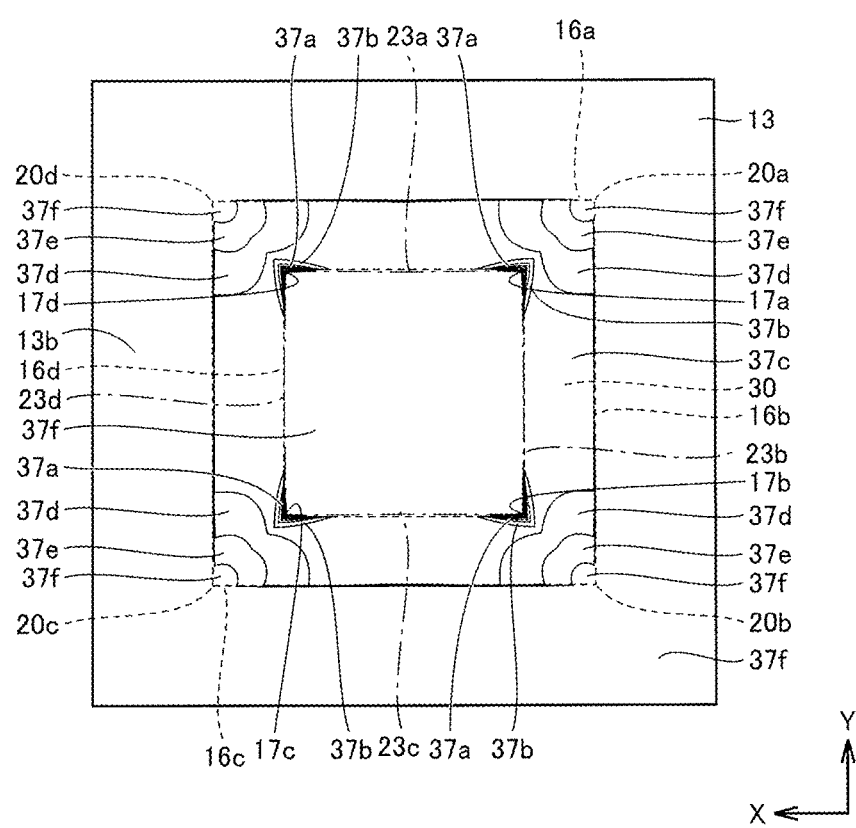
FIG. 6 is a view illustrating the temperature gradient in the first main surface of the support.

The temperature difference and the temperature gradient on the first main surface 13b of the support 13 in the photosensor 11a will be described here. FIG. 5 is a view illustrating the temperature distribution on the first main surface 13b of the support 13. FIG. 6 is a view illustrating the temperature gradient on the first main surface 13b of the support 13. FIG. 5 and FIG. 6 are based on the simulation results. In FIG. 5 and FIG. 6, the inner edges 16a, 16b, 16c, and 16d of the heat sink 14 are indicated by broken lines, and the outer edges 23a, 23b, 23c, and 23d of the infrared-absorbing film 23 are indicated by dash-dotted lines. In FIG. 5 and FIG. 6, the shape of the outer edge 13c of the support 13, the shape defined by the outer edges 23a, 23b, 23c, and 23d of the infrared-absorbing film 23, and the shape defined by the inner edges 16a, 16b, 16c, and 16d of the heat sink 14 are square for simplicity as viewed in the thickness direction of the support 13. The outer edges 23a, 23b, 23c, and 23d of the infrared-absorbing film 23 each have a length of 0.75 mm, and the inner edges 16a, 16b, 16c, and 16d of the heat sink 14 each have a length of 1.2 mm.

Referring to FIG. 5, regions 36a, 36b, 36c, 36d, 36e, 36f, 36g, and 36h divided by solid lines are regions within the same temperature range. The regions 36a, 36b, 36c, 36d, 36e, 36f, 36g, and 36h are arranged in descending order of temperature. The region in which the infrared-absorbing film 23 is disposed has the highest temperature, and the region in which the heat sink 14 is disposed has the lowest temperature. In the region 30 between the outer edges 23a, 23b, 23c, and 23d of the infrared-absorbing film 23 and the inner edges 16a, 16b, 16c, and 16d of the heat sink 14, the temperature gradually decreases from the region in which the infrared-absorbing film 23 is disposed toward the region in which the heat sink 14 is disposed. However, the temperature gradient is not constant in the region 30.

Referring to FIG. 6, regions 37a, 37b, 37c, 37d, 37e, and 37f are regions with the same temperature gradient. The regions 37a, 37b, 37c, 37d, 37e, and 37f are arranged in descending order of temperature gradient. The region in which the infrared-absorbing film 23 is disposed and the region in which the heat sink 14 is disposed both belong to the region 37f and show almost no temperature gradient. The region 30 between the outer edges 23a, 23b, 23c, and 23d of the infrared-absorbing film 23 and the inner edges 16a, 16b, 16c, and 16d of the heat sink 14 belongs to the regions 37b, 37c, 37d, and 37e having temperature gradient and shows a large temperature gradient. In particular, the regions 37a and 37b near the corners 17a, 17b, 17c, and 17d show a large temperature gradient.

In the photosensor 11a, the first regions 28a of the first material layers 21a, 21b, 21c, and 21d are disposed in the region 30 between the outer edges 23a, 23b, 23c, and 23d of the infrared-absorbing film 23 and the inner edges 16a, 16b, 16c, and 16d of the heat sink 14 as viewed in the thickness direction of the support 13. The region 30 between the outer edges 23a, 23b, 23c, and 23d of the infrared-absorbing film 23 and the inner edges 16a, 16b, 16c, and 16d of the heat sink 14 shows a large temperature gradient. By disposing the first regions 28a in this region 30, a large electrical energy based on temperature differences can be outputted using a large temperature gradient formed between the first regions 28a and the second regions 28b. Since the first material layers 21a, 21b, 21c, and 21d are not designed to extend from the region in which the infrared-absorbing film 23 is disposed to the region in which the heat sink 14 is disposed, the first material layers 21a, 21b, 21c, and 21d can be shortened. This configuration can reduce the effect of the electrical resistance and thermal resistance of the first material layers 21a, 21b, 21c, and 21d. As a result, the S/N ratio is increased to improve the specific detectivity D* of the photosensor 11a.

In this embodiment, the third regions 29a of the second material layers 22a, 22b, 22c, and 22d are disposed in the region 30 between the outer edges 23a, 23b, 23c, and 23d of the infrared-absorbing film 23 and the inner edges 16a, 16b, 16c, and 16d of the heat sink 14 as viewed in the thickness direction of the support 13. The region 30 between the outer edges 23a, 23b, 23c, and 23d of the infrared-absorbing film 23 and the inner edges 16a, 16b, 16c, and 16d of the heat sink 14 shows a large temperature gradient. By disposing the third regions 29a in this region, a large electrical energy based on temperature differences can be outputted using a large temperature gradient formed between the third regions 29a and the fourth regions 29b. Since the third regions 29a are not designed to extend from the region in which the infrared-absorbing film 23 is disposed to the region in which the heat sink 14 is disposed, the second material layers 22a, 22b, 22c, and 22d can be shortened. This configuration can reduce the effect of the electrical resistance and thermal resistance of the second material layers 22a, 22b, 22c, and 22d. As a result, the S/N ratio is increased to improve the specific detectivity D* of the photosensor 11a.

According to this embodiment, the infrared-absorbing film 23 includes the corner 17a. As viewed in the thickness direction of the support 13, the corner 17a is defined by the outer edge 23a extending in the first direction and the outer edge 23b extending in the second direction intersecting the first direction and connected to the outer edge 23a at the first vertex 18a, and the corner 17a protrudes toward the outer edge 13c of the support 13. The infrared-absorbing film 23 includes the corners 17b, 17c, and 17d. In the region 30 between the outer edges 23a, 23b, 23c, and 23d of the infrared-absorbing film 23 and the inner edges 16a, 16b, 16c, and 16d of the heat sink 14, regions near the corners 17a, 17b, 17c, and 17d protruding toward the outer edge 13c of the support 13 are unlikely to decrease their temperature steeply toward the outer edge 13c and tend to maintain high temperature. Therefore, the first regions 28a are disposed in regions near the corners 17a, 17b, 17c, and 17d to efficiently use portions having a large temperature gradient, whereby the S/N ratio is increased to improve the specific detectivity D* of the photosensor 11a.

According to this embodiment, the first region 28a of the first material layer 21a is disposed in the region 33a between the extension line 31a of the outer edge 23a extending away from the outer edge 23a across the first vertex 18a and the extension line 32a of the outer edge 23b extending away from the outer edge 23b across the first vertex 18a. The region 33a between the extension line 31a of the outer edge 23a and the extension line 32a of the outer edge 23b tends to have a large temperature gradient. The first region 28a of the first material layer 21a is thus disposed in the region 33a having a large temperature gradient between the extension line 31a of the outer edge 23a and the extension line 32a of the outer edge 23b, whereby the S/N ratio is increased to improve the specific detectivity D* of the photosensor 11a. The first regions 28a of the other first material layers 21b, 21c, and 21d are also disposed in the regions 33b, 33c, and 33d having a large temperature gradient similarly. The third regions 29a of the second material layers 22a, 22b, 22c, and 22d are also disposed in the regions 33a, 33b, 33c, and 33d having a large temperature gradient. The S/N ratio can thus be further increased to improve the specific detectivity D* of the photosensor 11a.

According to this embodiment, the corner 17a has an angle of 90 degrees or less as viewed in the thickness direction of the support 13. Specifically, the corner 17a has an angle of 90 degrees. When the corner 17a has an angle of 90 degrees or less, it is easy to maintain high temperature in a region near the corner 17a defined by the outer edge 23a and the outer edge 23b. The temperature gradient can thus be increased by assuredly maintaining high temperature in a region near the corner 17a. The same applies to the other corners 17b, 17c, and 17d. Therefore, the specific detectivity D* of the photosensor 11a can be improved more efficiently.

In this embodiment, the first material layer 21 is made of a semiconductor. A semiconductor has a relatively low thermal conductivity. The specific detectivity D* of the photosensor 11a can be thus improved.

In this embodiment, the thermoelectric conversion material section 12 includes a plurality of the second material layers 22 that convert thermal energy into electrical energy and that are made of Bi of the second conductivity type different from the conductivity type of the first material layers 21. The second material layers 22 and the first material layers 21 are alternately connected to each other. Therefore, the output based on temperature differences is increased by using a material having a relatively low thermal conductivity to further improve the specific detectivity of the photosensor 11a.

According to this embodiment, the length of the first material layers 21a to 21d is 10% or more and 120% or less of the distance from the first vertices 18a to 18d to the inner edges 16a to 16d of the heat sink 14 at the shortest distance from the first vertices 18a to 18d. The relationship between the length of the first material layers 21a to 21d and the distance from the first vertices 18a to 18d to the inner edges 16a to 16d of the heat sink 14 at the shortest distance from the first vertices 18a to 18d is described below.

Figure 7:
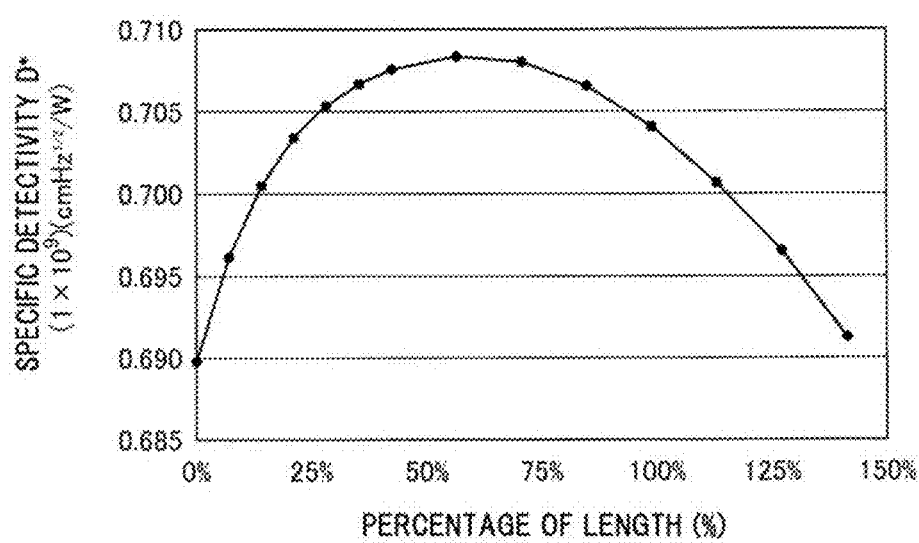
FIG. 7 is a graph showing the relationship between the percentage of the length of a first material layer and the specific detectivity D* of the photosensor.

FIG. 7 is a graph showing the relationship between the percentage of the length of the first material layer 21a and the specific detectivity D* of the photosensor. In FIG. 7, the horizontal axis represents the percentage of the length of the first material layer 21a, and the vertical axis represents the specific detectivity D* of the photosensor 11a. In FIG. 7, 0% of the length indicates the absence of the first material layer 21a having the above configuration, and 100% of the length indicates the length corresponding to the distance from the first vertex 18a to the inner edges 16a to 16d of the heat sink 14 at the shortest distance from the first vertex 18a. In FIG. 7, 141% of the length indicates the length corresponding to the distance from the first vertex 18a to the second vertex 20a at which the inner edge 16a serving as a first inner edge intersects the inner edge 16b serving as a second inner edge.

To calculate the specific detectivity D* of the photosensor 11a, a light source, a blackbody furnace at 500 K, is chopped at a chopping frequency of 5 Hz using a mechanical chopper, with the photosensor 11a and the light source at a distance of 30 cm, and chopping frequency components in the device output are synchronously detected by a lock-in amplifier. The output from the photosensor 11a is analyzed by a spectrum analyzer, and a noise level is measured to calculate the specific detectivity D*.

Referring FIG. 7, the specific detectivity D* is the lowest when the percentage of the length is 0%. The specific detectivity D* increases with increasing percentage of the length. The specific detectivity D* reaches the highest value when the percentage of the length is 60%. The specific detectivity D* then decreases with increasing percentage of the length.

The length of the first material layer 21a is set to 10% or more and 120% or less of the distance from the first vertex 18a to the inner edges 16a to 16d of the heat sink 14 at the shortest distance from the first vertex 18a. The ratio of the length of the first material layer 21a to the distance from the first vertex 18a to the inner edges 16a to 16d of the heat sink 14 at the shortest distance from the first vertex 18a is adjusted in this way. The effect of the length of the first material layer 21a and the output of electrical energy generated by the temperature gradient are made well balanced to improve the specific detectivity D* of the photosensor 11a more efficiently. The same applies to the length of the other first material layers 21b, 21c, and 21d and the second material layers 22a, 22b, 22c, and 22d to further improve the specific detectivity D* of the photosensor 11a.

In this embodiment, the corners 17a, 17b, 17c, and 17d each have an angle of 90 degrees. The angle of the corners is not limited to 90 degrees, and the shape defined by the outer edges of the infrared-absorbing film 23 may include a plurality of corners each having an angle of 90 degrees or less and protruding toward the outer edge 13c of the support 13 as viewed in the thickness direction of the support 13. It is thus easy to increase the number of corners prone to high temperatures in the photosensor 11a to increase the number of regions having a large temperature gradient. It is therefore easy to increase the S/N ratio to improve the specific detectivity D* of the photosensor 11a.

Second Embodiment

Figure 8:
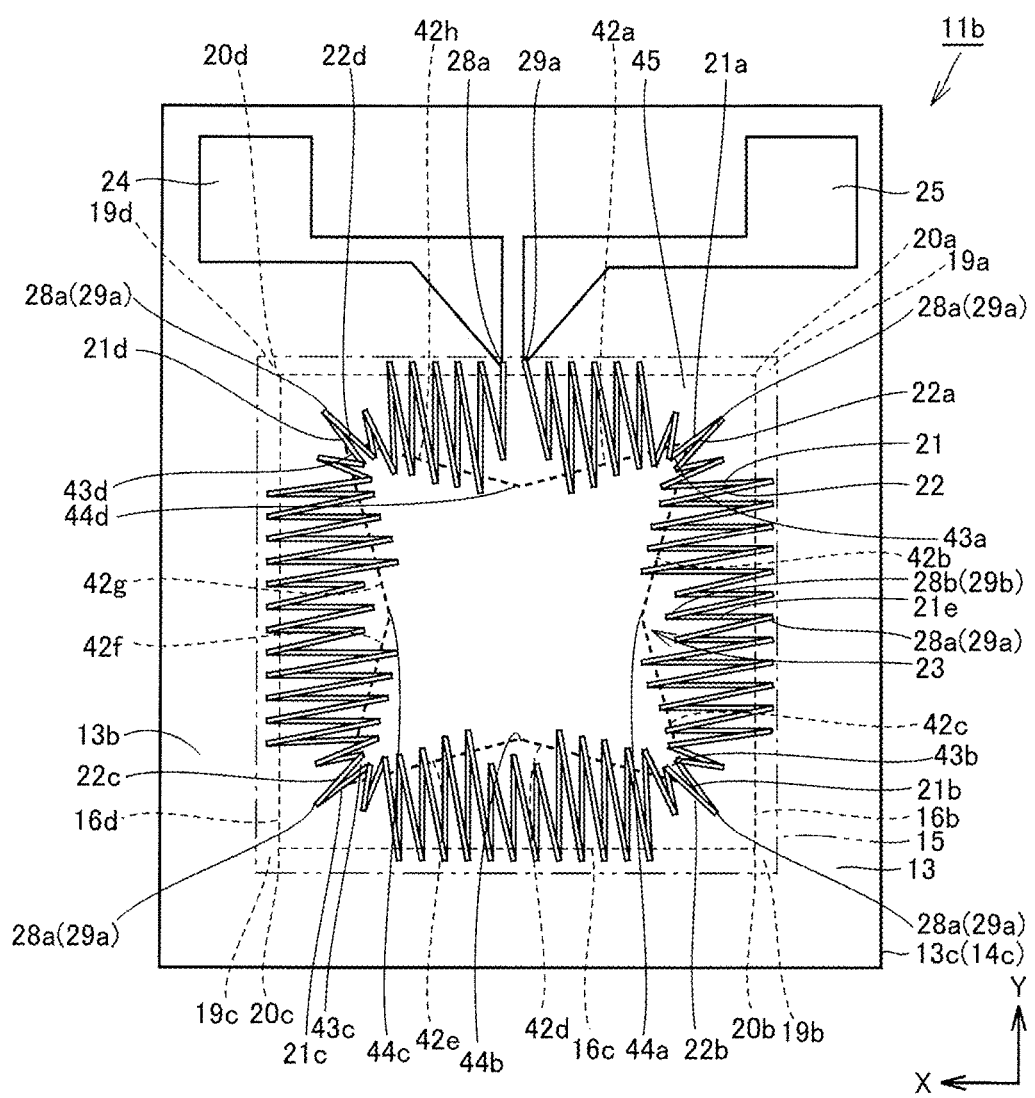
FIG. 8 is a schematic plan view of the appearance of a photosensor according to a second embodiment.

Next, a second embodiment which is another embodiment will be described. FIG. 8 is a schematic plan view of the appearance of a photosensor according to the second embodiment. FIG. 8 corresponds to FIG. 1 in the first embodiment. The second embodiment is different from the first embodiment in the shape of first material layers 21, the shape of second material layers 22, and the shape of an infrared-absorbing film 23. In FIG. 8, the outer edges of the infrared-absorbing film 23 when it is disposed are indicated by broken lines.

Referring to FIG. 8, a photosensor 11b in the second embodiment includes a support 13, a heat sink 14, a plurality of first material layers 21 including first material layers 21a, 21b, 21c, 21d, and 21e, a plurality of second material layers 22 including second material layers 22a, 22b, 22c, and 22d, an infrared-absorbing film 23, a first electrode 24, and a second electrode 25. The first material layers 21 alternate with the second material layers 22 such that first regions 28a other than a first region 28a connected to the first electrode 24 are connected to third regions 29a other than a third region 29a connected to the second electrode 25, and second regions 28b are connected to fourth regions 29b.

The external shape of the infrared-absorbing film 23 is defined by eight outer edges 42a, 42b, 42c, 42d, 42e, 42f, 42g, and 42h. As viewed in the thickness direction of the support 13, the infrared-absorbing film 23 is not square unlike that in the first embodiment, and a corner 43a defined by the outer edge 42a and the outer edge 42b and serving as a first corner, a corner 43b defined by the outer edge 42c and the outer edge 42d and serving as a first corner, a corner 43c defined by the outer edge 42e and the outer edge 42f and serving as a first corner, and a corner 43d defined by the outer edge 42g and the outer edge 42h and serving as a first corner each have an acute angle, or an angle or less than 90 degrees. The infrared-absorbing film 23 has the same area as the infrared-absorbing film 23 in the first embodiment. A vertex 44a at which the outer edge 42b intersects the outer edge 42c, a vertex 44b at which the outer edge 42d intersects the outer edge 42e, a vertex 44c at which the outer edge 42f intersects the outer edge 42g, and a vertex 44d at which the outer edge 42h intersects the outer edge 42a are closer to the center of the infrared-absorbing film 23 than the corners 43a, 43b, 43c, and 43d as viewed in the thickness direction of the support 13. The shape of the infrared-absorbing film 23 is different from that of the infrared-absorbing film 23 having a square shape in the first embodiment in that the midpoints of four sides of the infrared-absorbing film 23 are closer to the center of the infrared-absorbing film 23.

With regard to the first material layers 21a, 21b, 21c, and 21d, the first regions 28a of the first material layers 21a, 21b, 21c, and 21d are disposed in a region 45 between the outer edges 42a, 42b, 42c, 42d, 42e, 42f, 42g, and 42h of the infrared-absorbing film 23 and the inner edges 16a, 16b, 16c, and 16d of the heat sink 14 as viewed in the thickness direction of the support 13. The first regions 28a of the first material layers 21 adjacent to the first material layers 21a, 21b, 21c, and 21d are also disposed in the region 45 similarly.

With regard to the first material layer 21e closest to the vertex 44a, the first region 28a of the first material layer 21e is disposed on the heat sink 14, and the second region 28b is disposed in the region 45 between the outer edges 42a, 42b, 42c, 42d, 42e, 42f, 42g, and 42h of the infrared-absorbing film 23 and the inner edges 16a, 16b, 16c, and 16d of the heat sink 14 as viewed in the thickness direction of the support 13. The same applies to the first material layers 21 adjacent to the first material layer 21e. The same also applies to the first material layers 21 closest to the vertices 44b, 44c, and 44d.

This configuration enables the output of a large electrical energy based on temperature differences using a large temperature gradient formed between the first regions 28a and the second regions 28b. Since the first material layers 21a, 21b, 21c, 21d, and 21e are not designed to extend from the region in which the infrared-absorbing film 23 is disposed to the region in which the heat sink 14 is disposed in this embodiment, the first material layers 21a, 21b, 21c, 21d, and 21e can be shortened. This configuration can reduce the effect of the electrical resistance and thermal resistance of the first material layers 21a, 21b, 21c, 21d, and 21e. As a result, the S/N ratio is increased to improve the specific detectivity D* of the photosensor 11b.

Figure 9:
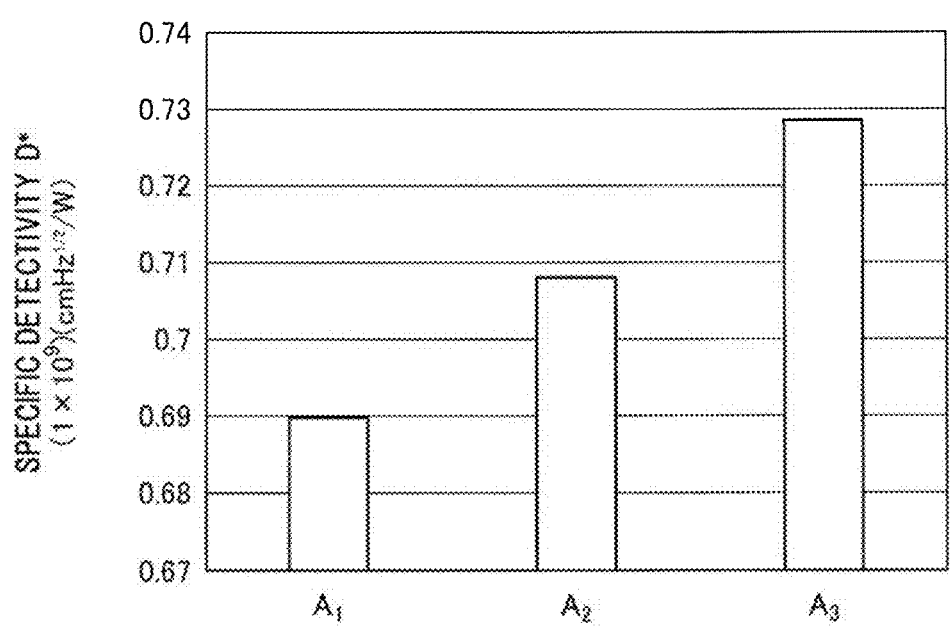
FIG. 9 is a graph showing the relationship between photosensors having different shapes and the specific detectivity D* of the photosensors.

FIG. 9 is a graph showing the relationship between photosensors having different shapes and the specific detectivity D* of the photosensors. In FIG. 9, the horizontal axis represents the shapes $A_1$, $A_2$, and $A_3$ of photosensors having different shapes, and the vertical axis represents the specific detectivity D* of the photosensor. In FIG. 9, the shape $A_1$ represents the case where the shape defined by the outer edges 23a, 23b, 23c, and 23d of the infrared-absorbing film 23 and the shape defined by the inner edges 16a, 16b, 16c, and 16d of the heat sink 14 are both square, and the percentage of the length of the first material layer 21a is 0%. The shape $A_2$ represents the case where the shape defined by the outer edges 23a, 23b, 23c, and 23d of the infrared-absorbing film 23 and the shape defined by the inner edges 16a, 16b, 16c, and 16d of the heat sink 14 are both square, and the percentage of the length of the first material layer 21a is 50%. The shape $A_3$ represents the photosensor 11b according to the second embodiment.

Referring to FIG. 9, the specific detectivity D* for the shape $A_1$ does not reach 0.69 ($1 \times 10^9$) (cm $Hz^{1/2}$/W). The specific detectivity D* for the shape $A_2$ is higher than that for shape $A_1$ and slightly below 0.71 ($1 \times 10^9$) (cm $Hz^{1/2}$/W). The specific detectivity D* for the photosensor 11b according to the second embodiment indicated by the shape $A_3$ is higher than those for the shape $A_1$ and the shape $A_2$ and is 0.72 ($1 \times 10$) (cm $Hz^{1/2}$/W) or higher and slightly below 0.73 ($1 \times 10^9$) (cm $Hz^{1/2}$/W).

Third Embodiment

Figure 10:
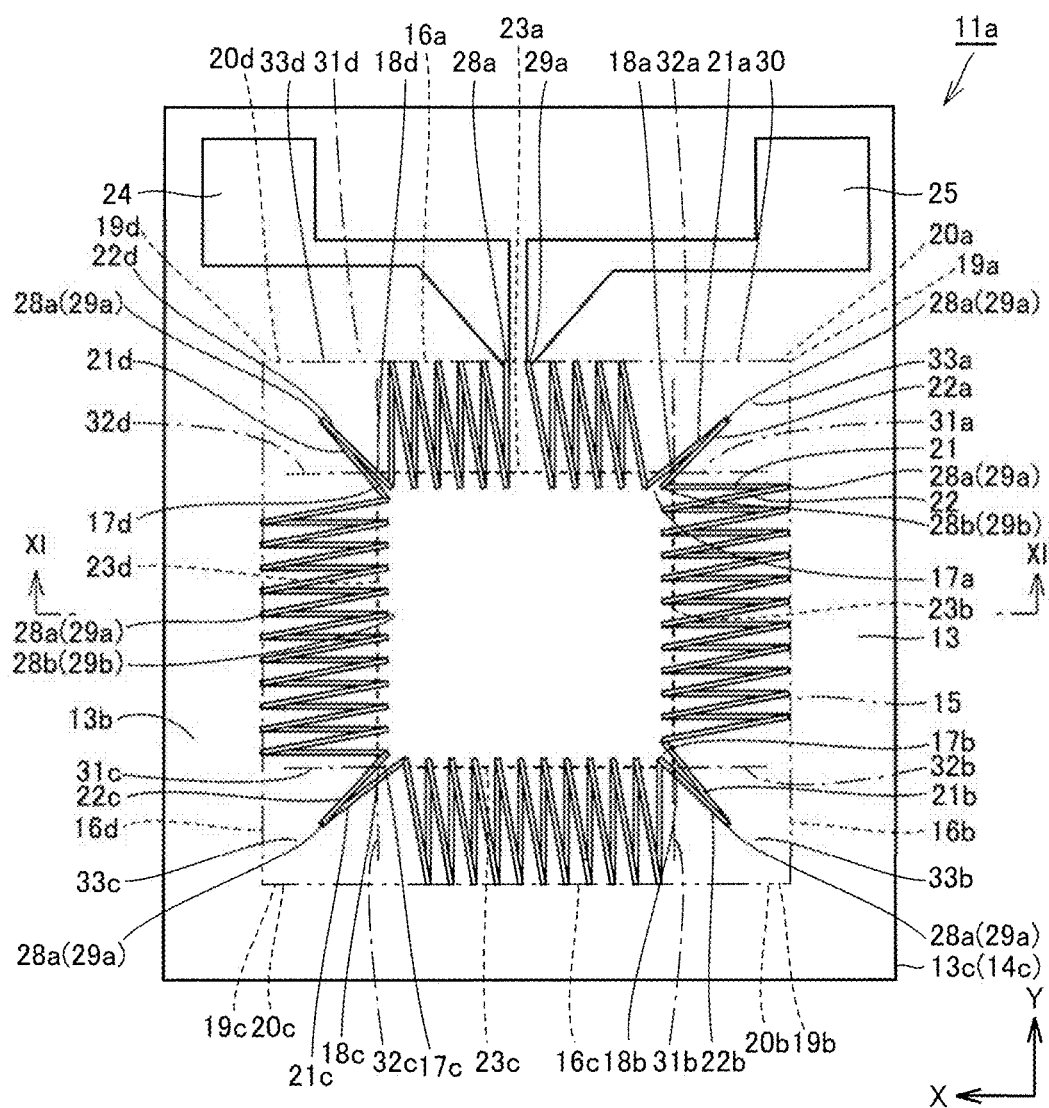
FIG. 10 is a schematic plan view of the appearance of a photosensor according to a third embodiment.
Figure 11:
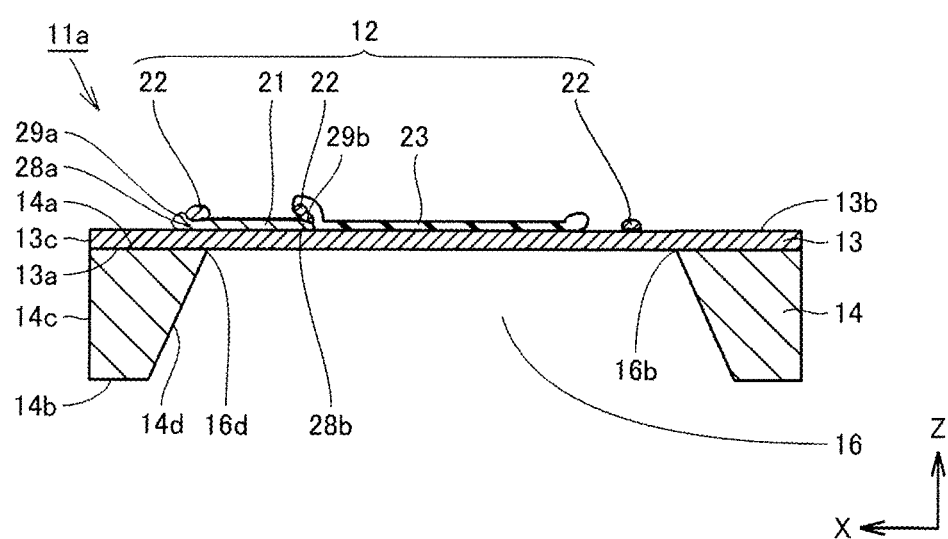
FIG. 11 is a schematic cross-sectional view illustrating part of a cross section taken along line XI-XI of FIG. 10.

Next, a third embodiment which is another embodiment will be described. FIG. 10 is a schematic plan view of the appearance of a photosensor according to the third embodiment. FIG. 10 corresponds to FIG. 1 in the first embodiment. FIG. 11 corresponds to FIG. 3 in the first embodiment. In the third embodiment, the same components as those in the first embodiment will not be described. The third embodiment is different from the first embodiment in that the photosensor in the third embodiment has no insulating film 26. In the third embodiment, first material layers 21 are disposed in contact with a first main surface of a support 13. Second material layers 22 are disposed on the first main surface of the support 13 or on part of the first material layers 21. An infrared-absorbing film 23 is made of resin. It is also acceptable to change the shape of the first material layers 21, the shape of the second material layers 22, and the shape of the infrared-absorbing film 23 to the same shapes as in the second embodiment.

Other Embodiments In the above embodiments, carbon may be used as the infrared-absorbing film 23. The first material layers 21 are made of a compound semiconductor containing Si, Ge, and Au as elements. The material of the first material layers 21 is not limited to this. The first material layers 21 may be made of a compound semiconductor free of Au, a compound semiconductor containing Mn and Si as elements, a compound semiconductor containing Sn and Se as elements, or a compound semiconductor containing Cu and Se as elements. The first material layers 21 may be made of, for example, a Si simple substance acting as a semiconductor.

In the above embodiments, the second material layers 22 are made of Bi. The material of the second material layers 22 is not limited to this. The second material layers 22 may be made of at least one of metals and semiconductors that convert thermal energy into electrical energy and that have a conductivity type different from that of the first material layers 21. Specifically, for example, the second material layers 22 may be made of an n-type compound semiconductor other than Bi. When the second material layers are made of the second conductivity type (n-type) semiconductor, the output based on temperature differences is increased by using a material having a relatively low thermal conductivity to further improve the specific detectivity of the photosensors 11a and 11b. The second material layers 22 may be made of metal. In other words, the thermoelectric conversion material section 12 may include the first material layers 21 and metal layers having an elongated shape and arranged like the second material layers 22 described above. Specifically, for example, the first material layers 21 are made of Si, and the metal layers are made of Al. This configuration may be employed particularly when the properties of the photosensors 11a and 11b mainly depend on the properties of the material of the first material layers 21. The conductivity of the second material layers 22 is accordingly improved to increase the electrical conductance of the photosensors 11a and 11b, whereby the specific detectivity of the photosensors 11a and 11b can further be improved. Another material of the second material layers 22 may be, for example, antimony (Sb). The second material layers 22 may be made of an alloy of Bi and tellurium (Te) or an alloy of Bi, Te, and Sb. Although the photosensors 11a and 11b each include a plurality of the first material layers 21 and a plurality of the second material layers 22 in the above embodiments, the photosensors 11a and 11b are simply required to include a pair of the first material layer 21 and the second material layer 22.

It should be understood that the embodiments disclosed herein are illustrative in any respect and non-restrictive from any viewpoint. The scope of the present disclosure is defined by the claims, rather than the above description, and is intended to include all modifications within the meaning and range of equivalency of the claims.

What is claimed is:

1. A photosensor comprising:
   a support;
   a thermoelectric conversion material section that is disposed on a first main surface of the support and that includes a plurality of first material layers each having an elongated shape and a plurality of second material layers each having electrical conductivity and an elongated shape, the first material layers and the second material layers each being configured to convert thermal energy into electrical energy;
   a heat sink that is disposed on a second main surface of the support and along an outer edge of the support;
   a light-absorbing film that is disposed in a region surrounded by inner edges of the heat sink as viewed in a thickness direction of the support so as to form temperature differences on the first main surface of the support in longitudinal directions of the first material layers, the light-absorbing film being configured to convert received light into thermal energy;
   a first electrode; and
   a second electrode spaced apart from the first electrode,
   wherein each first material layer includes a first region including a first end on one side in the corresponding longitudinal direction and a second region including a second end on the other side in the corresponding longitudinal direction,
   each second material layer includes a third region including a third end on one side in the corresponding longitudinal direction and a fourth region including a fourth end on the other side in the corresponding longitudinal direction,
   the first region and the second region are respectively connected to the third region and the fourth region, so that the first material layers and the second material layers are alternately connected to each other in series,
   the endmost first material layer is connected to the first electrode, and the endmost second material layer is connected to the second electrode, and
   the first region is disposed in a region between outer edges of the light-absorbing film and the inner edges of the heat sink as viewed in the thickness direction of the support.

2. The photosensor according to claim 1, wherein the first material layers are disposed in contact with the first main surface of the support, and the second material layers are disposed on the first main surface of the support or on part of the first material layers.

3. The photosensor according to claim 1, further comprising an insulating film disposed in contact with the support,
   wherein the second material layers are disposed on part of the insulating film and on part of the first material layers.

4. The photosensor according to claim 1, wherein, as viewed in the thickness direction of the support, the light-absorbing film includes a first corner defined by a first outer edge extending in a first direction and a second outer edge extending in a second direction intersecting the first direction, the second outer edge being connected to the first outer edge at a first vertex, the first corner protruding toward the outer edge of the support.

5. The photosensor according to claim 4, wherein the first region is disposed in a region between an extension line of the first outer edge extending away from the first outer edge across the first vertex and an extension line of the second outer edge extending away from the second outer edge across the first vertex.

6. The photosensor according to claim 4, wherein the first material layers each have a length of 10% or more and 120% or less of a distance from the first vertex to an inner edge of the heat sink at the shortest distance from the first vertex.

7. The photosensor according to claim 4, wherein the first corner has an angle of 90 degrees or less as viewed in the thickness direction of the support.

8. The photosensor according to claim 7, wherein the light-absorbing film has a plurality of the first corners, and the first corners each have an angle of 90 degrees or less as viewed in the thickness direction of the support.

9. The photosensor according to claim 1, wherein joints between the second regions and the fourth regions overlap the light-absorbing film as viewed in the thickness direction of the support, and
a geometric shape defined by a virtual line connecting adjacent ones of the joints forms along the outer edges of the light-absorbing film as viewed in the thickness direction of the support.

10. The photosensor according to claim 1, wherein the first or second material layers or the first and second material layers are made of semiconductors.

11. The photosensor according to claim 1, wherein the first material layers and the second material layers are made of semiconductors, and the second material layers have a conductivity type different from that of the first material layers and are configured to convert temperature differences between the third regions and the fourth regions into electrical energy.

12. The photosensor according to claim 1, wherein the first material layers are made of a semiconductor containing Si and Ge as base elements.

13. The photosensor according to claim 5, wherein the first material layers each have a length of 10% or more and 120% or less of a distance from the first vertex to an inner edge of the heat sink at the shortest distance from the first vertex.

14. The photosensor according to claim 5, wherein the first corner has an angle of 90 degrees or less as viewed in the thickness direction of the support.

15. The photosensor according to claim 6, wherein the first corner has an angle of 90 degrees or less as viewed in the thickness direction of the support.

16. The photosensor according to claim 2, wherein the first material layers and the second material layers are made of semiconductors, and the second material layers have a conductivity type different from that of the first material layers and are configured to convert temperature differences between the third regions and the fourth regions into electrical energy.

17. The photosensor according to claim 3, wherein the first material layers and the second material layers are made of semiconductors, and the second material layers have a conductivity type different from that of the first material layers and are configured to convert temperature differences between the third regions and the fourth regions into electrical energy.

18. The photosensor according to claim 4, wherein the first material layers and the second material layers are made of semiconductors, and the second material layers have a conductivity type different from that of the first material layers and are configured to convert temperature differences between the third regions and the fourth regions into electrical energy.

19. The photosensor according to claim 5, wherein the first material layers and the second material layers are made of semiconductors, and the second material layers have a conductivity type different from that of the first material layers and are configured to convert temperature differences between the third regions and the fourth regions into electrical energy.

20. The photosensor according to claim 6, wherein the first material layers and the second material layers are made of semiconductors, and the second material layers have a conductivity type different from that of the first material layers and are configured to convert temperature differences between the third regions and the fourth regions into electrical energy.

21. The photosensor according to claim 7, wherein the first material layers and the second material layers are made of semiconductors, and the second material layers have a conductivity type different from that of the first material layers and are configured to convert temperature differences between the third regions and the fourth regions into electrical energy.

22. The photosensor according to claim 8, wherein the first material layers and the second material layers are made of semiconductors, and the second material layers have a conductivity type different from that of the first material layers and are configured to convert temperature differences between the third regions and the fourth regions into electrical energy.

23. The photosensor according to claim 9, wherein the first material layers and the second material layers are made of semiconductors, and the second material layers have a conductivity type different from that of the first material layers and are configured to convert temperature differences between the third regions and the fourth regions into electrical energy.

* * * * *